United States Patent [19]

Scifres et al.

[11] 4,297,653

[45] Oct. 27, 1981

[54] HYBRID SEMICONDUCTOR LASER/DETECTORS

[75] Inventors: Donald R. Scifres; Wolfgang E. Stutius, both of Los Altos, Calif.

[73] Assignee: Xerox Corporation, Stamford, Conn.

[21] Appl. No.: 34,238

[22] Filed: Apr. 30, 1979

[51] Int. Cl.³ ............................................. H01S 3/19
[52] U.S. Cl. ........................... 331/94.5 S; 331/94.5 H; 357/19
[58] Field of Search ................. 331/94.5 H, 94.5 P, 331/94.5 S; 357/15, 17, 30, 19

[56] References Cited

U.S. PATENT DOCUMENTS

| | | | |
|---|---|---|---|
| 3,842,263 | 10/1974 | Kornrumpf et al. | 357/19 X |
| 3,855,546 | 12/1974 | Carr | 331/94.5 H |
| 4,058,821 | 11/1977 | Miyoshi et al. | 357/19 |
| 4,074,143 | 2/1978 | Rokos | 250/552 |
| 4,079,404 | 3/1978 | Comerford et al. | 357/19 |
| 4,092,614 | 5/1978 | Sakuma et al. | 331/94.5 P |
| 4,137,543 | 1/1979 | Beneking | 357/30 |
| 4,156,206 | 5/1979 | Comerford et al. | 331/94.5 C |

OTHER PUBLICATIONS

J. D. Crow et al., "Gallium Arsenide Laser-Array-on-Silicon Package," *Applied Optics,* vol. 17, No. 3, pp. 479-485, Feb. 1, 1978.

*Primary Examiner*—James W. Davie
*Attorney, Agent, or Firm*—W. Douglas Carothers, Jr.

[57] ABSTRACT

A semiconductor injection laser is mounted on a silicon substrate. An optical detector in the form of a Schottky barrier is integral to the substrate and aligned to detect a portion of the light from one of the light emitting facets of the laser. The detector is connected to the current control circuit for the laser to provide a feedback signal which is proportional to the light deflected from the facet. The feedback signal provides an input to the control circuit to adjust the operating current of the laser to provide a predetermined and maintained optical power output level. Means are provided for enhancing light collecting efficiency. The connection of the laser and detector to the control circuit is accomplished in a manner so that the operating current of the laser does not electrically interfere with the electrical operation of the detector. The control circuit may be provided on the substrate employing VLSI technology.

10 Claims, 13 Drawing Figures

HYBRID SEMICONDUCTOR LASER/DETECTORS

This invention relates to optical semiconductor circuits and, in particular, to optical feedback control of semiconductor diode lasers all on a single semiconductor chip.

The optical output power of a semiconductor injection or diode laser is readily controlled by adjusting the laser current. The laser being a threshold device, the threshold and external quantum efficiency is strongly dependent on the operating temperature of the laser which affected by aging.

Also fluctuations in optical power output occur due to changes in ambient temperature of due to partial laser degradation over a period of time. If these devices are operated at a constant current level, rather large variations in optical power output would be experienced over a period of time. As a consequence, in practical optical systems applications, such as optical communications and integrated optics, the laser optical power output must be stabilized.

Such stabilization is usually accomplished by monitoring a portion of the laser light output with an optical detector. The detected signal is then used to drive a feedback circuit which controls the laser current. Since the light emerging from the rear facet of the laser is usually directly proportional to the light emitted from the front facet of the laser, detection of the rear facet emission is sufficient to produce a feedback signal for control of the laser current circuit. In the past, these optical power feedback signals have been provided either by positioning the light sensitive active region of the detector directly behind the rear facet of the laser or by attaching an optical fiber to the rear laser facet permitting remote positioning of the detector from the laser. Also detectors have been employing in an optical integrated circuit configuration with a diode laser where optical communication between the detector and laser has been via a contiguous passive waveguide layer between the laser and the detector on the supporting substrate.

SUMMARY OF THE INVENTION

A hybrid semiconductor laser/detector is provided on a single semiconductor substrate. The diode laser is mounted on the substrate which acts as a heat sink. An optical detector, such as a silicon p-n junction diode or a Schottky barrier diode, may be fabricated on or in the substrate and positioned in a manner to receive a small portion of the light emitted from the rear facet of the laser. The output signal developed from the detector may be used as a feedback signal to control the drive current circuit for laser. For accurate feedback and current control, the hybrid device may be constructed so that the pumping current for the diode laser does not interfere with the operation of the optical detector. The drive circuit electronics may be integrated on the substrate together with the optical detector employing conventional VLSI technology.

Means may be formed on the substrate to enhance light collecting efficiency. This may take the form of an etched channel in the substrate between the detector and the laser, or an optical collection device on the substrate surface. Further, the diode laser may be mounted on the substrate at an elevation below that of the optical detector.

An array of diode lasers may be mounted on a single substrate with an individaul optical detector fabricated for each diode laser and adapted to control its corresponding operating current to stabilize the optical output so that the output of all the lasers may be maintained at the same desired level.

The advantages realized are simplicity of fabrication with the elimination of critical alignment of discrete detectors and the critical alignment and mounting of optical fibers relative to the rear facet of a diode laser.

Other objects and attainments together with a fuller understanding of the invention will become apparent and appreciated by referring to the following description and claims taken in conjunction with the accompanying drawings.

DESCRIPTION OF THE PREFERRED EMBODIMENT STRUCTURE

Figure 1:
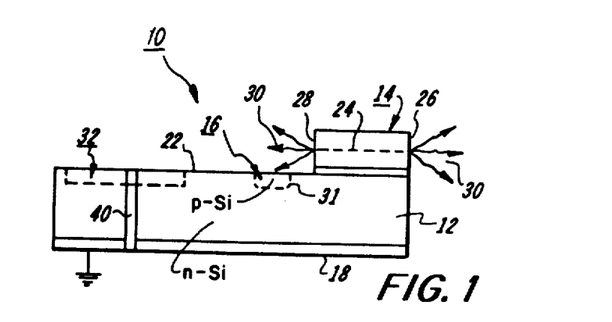
FIG. 1 is side elevation of a hybrid laser/detector employing a p-n junction as a detector and integrated control circuitry.
Figure 2:
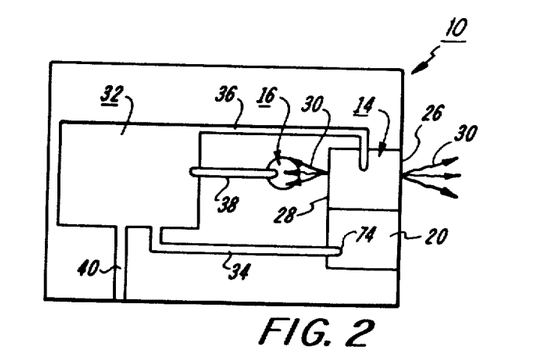
FIG. 2 is plan of the hybrid laser/detector shown in FIG. 1.
Figure 3:
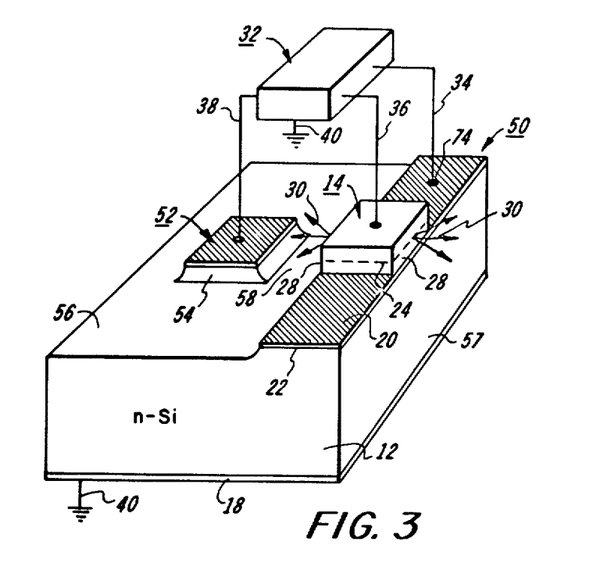
FIG. 3 is a perspective view of another embodiment of a hybrid laser/detector employing a Schottky barrier as a detector.

Reference is now made to the structures shown in FIGS. 1 through 5 followed by an example of fabrication relative to the structure shown in FIG. 3.

In FIGS. 1 and 2, the hybrid laser/detector 10 comprises a substrate 12 upon which is mounted a semiconductor diode laser 14 and an integrated detector 16. The substrate 12 may be a silicon wafer having n type conductivity. A metalized surface 18 is provided on the bottom surface of the substrate 12. Diode laser 14 is mounted on a metalized area 20 provided on a portion of the surface 22 of the substrate 12.

The structure of the laser 14 is not critical to the present invention. For example, this laser may be a heterostructure injection laser having an active layer 24 with end mirror facets 26 and 28 from which light is emitted as illustrated by arrows 30.

Detector 16 is spaced from the rear laser facet 28 and comprises a diffused p-n junction 31 in the surface 22 of the substrate 12. The integration of this junction is easily fabricated by well known techniques. The resulting junction 31, when properly biased, will create electron hole pairs from light radiation incident on the junction producing a photocurrent that may be employed as a feedback signal.

The drive circuit electronics may be independent of the device 10 or integrated on the substrate as illustrated in FIGS. 1 and 2. The bias circuit 32 provides an output current to operate laser 14 and controls the current by an input signal from detector 16 representing a feedback indicative of the light intensity level emitted by the laser 14. Circuit 32 is connected to laser 14 by leads 34 and 36. Detector 16 is connected to circuit 32 by means of leads 38 and 40, the latter being at reference or ground potential. An examples of bias control circuit will be discussed in connection with FIGS. 4 and 7.

Figure 1A:
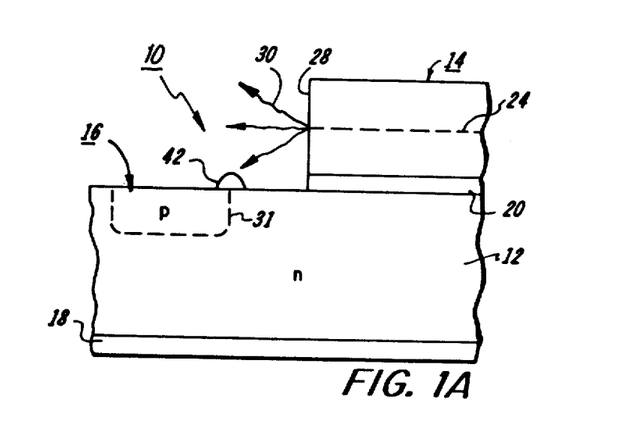
FIG. 1A is a detail from FIG. 1 illustrating a means by which light collecting efficiency may be enhanced.

Very little emited light from facet 28 need be collected by the detector 16. The amount of light collected may be below 2% of the light emitted from the facet. If desired the light collecting efficiency of the detector 16 of the hybrid laser/detector 10 of FIG. 1 can be enhanced by employing a optical collecting device 42, such as shown in FIG. 1A, which is an enlarged view of a portion of the device shown in FIG. 1. The device 42 is positioned in the region of the junction 31 of the detector 16. The device 42 may be a clear epoxy droplet forming a transparent dome that acts as a collecting lens. This device may be used with the detectors disclosed in other embodiments to be hereinafter described.

In the following description of FIGS. 3, 4 and 5, numerals employed in the description of the structure shown in FIGS. 1 and 2 are also employed in these Figures for identical components without further description.

The hybrid laser/detector 50 is similar to laser/detector 10 except that the bias circuit 32 is not integral with the substrate 12 and the detector 52 is a Schottky barrier positioned to collect a portion of the light 30 from the rear emitting facet 28. The Schottky barrier detector 52 is comprised of a continuous thin layer of an intermetallic compound, such, as chromium-gold or aluminum-gold. This compound is evaporated onto the surface of the substrate 12. The detector 52 is on a raised mesa or pad 54. This pad is fabricated by chemically etching the surface 56. The previously evaporated metalized surfaces 20 and 52 act as mask during etching. Etching also provides a channel 58 between the detector 52 and the laser 14 to allow more light to be collected by the Schottky barrier detector 52.

The Schottky barrier 52 has the advantages over the p-n junction 31 of requiring fewer processing steps and is significantly less expensive to fabricate.

The laser 14 may be a conventional 6 μm stripe double heterostructure injection laser mouted p-side down on the metalized pad 20. In this manner, substrate 12 provides a rather good heat sink.

The laser 14 is mounted at edge of surface 57 of substrate 12. Substrate 12, being a silicon wafer, the orthogonal cleaved crystal facet and the corresponding sharp corner between surfaces 22 and 57 simplify alignment of the laser with this edge.

Figure 4:
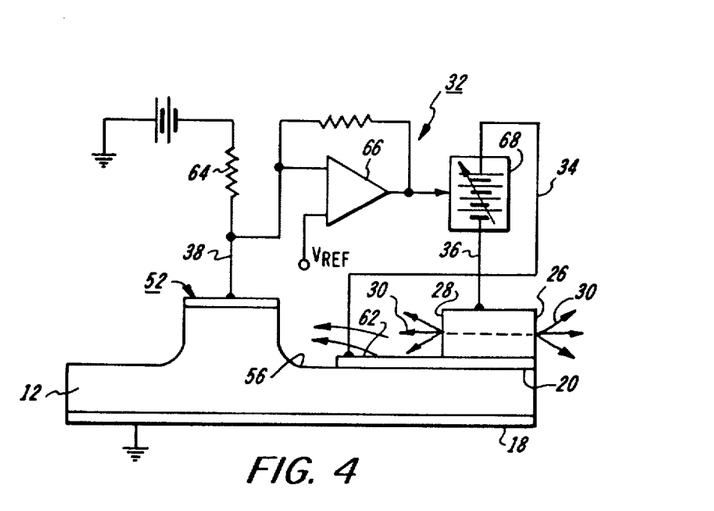
FIG. 4 is a side elevation of a modified form of the hybrid laser/detector shown in FIG. 3.

In FIG. 4, the laser/detector 60 is mounted on a metalized area 20 which extends out behind the laser 14. Also, the laser 14 is mounted on surface 56 at a lower elevation compared to detector 52. A two step metalization is performed in the fabrication of this device as compared to the structure of FIG. 3. After metalization of the detector 52, substrate 12 is etched to the surface level, as shown. Then, the metalized area 20 is evaporated on the substrate surface. Next, laser 14 is mounted on the area 20. The area 20 is large enough to leave a surface portion 62 exposed behind laser 14.

The lower elevation of the laser 14 permits enhanced light collecting efficiency by detector 52. Further enhancement is obtained by light emitted from the rear facet 28 being reflected off of the metalized exposed portion 62 toward the detector 52.

Figure 4A:
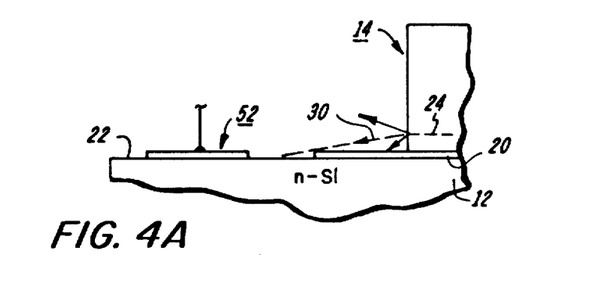
FIG. 4A is partial detailed view of a hybrid laser/detector arrangement.

An advantage of the structure shown in FIG. 4 is the elimination of the accurate alignment of laser 14 on the metalized area. This alignment is particularly crucial in the embodiment shown in FIG. 1 because the laser light emitting region 24 of laser 14 is usually only about 2 μm above the metalized pad 20 as best shown in FIG. 4A. In order for light to impinge on detector 52 when the detector is fabricated on the same surface 22 as the laser 14 is mounted, laser 14 must be exactly the same length as the metallized mounting pad 20. If the pad 20 is shorter than the length of the laser, poor heat sinking to the substrate results which is completely unacceptable even though laser emitted light will readily impinge on the detector 52. If the pad 20 is longer in length than laser 14, then the condition shown in FIG. 4a is present so that virtually no emitted light impinges on detector 52. It would not be practical to form the detector too close to pad 20 and precise alignment to receive the impinging light would be very difficult.

This is an undesirable situation since it is difficult to cleave the laser to the precise length, to metalize the substrate surface to the precise pad length and accurately position laser 14 on the pad 20 all within a few microns. This entire precise alignment difficulty is eliminated by the mounting configuration shown in FIG. 4 where laser 14 is mounted on plane at an elevation below detector 52. In the FIG. 4 configuration, the surface portion 62 can be functional to the hybrid device while eliminating problems relative to laser mounting alignment.

The laser 14 is forward biased above threshold and the detector 52 is back biased to absorb radiation from the rear laser facet 28. The radiation creates electron hole pairs via photon absorption in the barrier which produces a photocurrent. The photocurrent is converted by resistor 64 to a voltage which provides a feedback signal via input amplifier 66 to variable controlled DC power supply 68. The output leads 34 and 36 of supply 68 are connected to forward bias laser 14. Laser 14 is mounted with a p side down and in engagement with metalized area 20 in order that the substrate 12 may function as a heat sink for laser 14. Supply 68 controls the current to the laser 14 in response to voltage changes from amplifier 66, which changes are proportional to the amount of radiation detected by detector 52. In this manner, the laser current is adjusted by the feedback loop to maintain the optical power output of the laser 14 at a desired optical output, which is determined by the reference voltage, $V_{ref}$.

There may be differences in the light output of front and rear facets 26 and 28 due to the characteristics of laser 14. However, the light output levels should be proportional to each other and maintaining a constant light output at the rear facet 28 will result also in a constant light output at the front facet 26.

Figure 5:
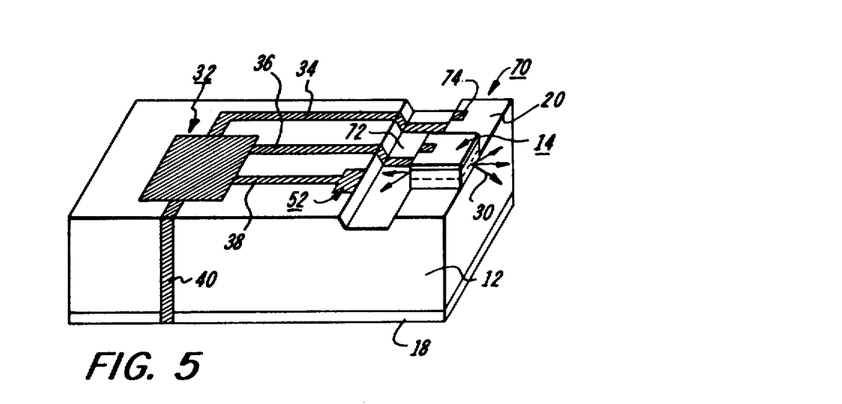
FIG. 5 is a perspective view of another modified form of the hybrid laser/detector shown in FIG. 3.

The hybrid laser/detector 70 in FIG. 5 is substantially the same as the structure shown in FIG. 3 except that bias circuit 32 is integrated in the surface of substrate 12, as in FIG. 1, and Schottky barrier detector 52 is separated from laser 14 by an etched channel 72. In this embodiment, the channel 72 is etched after the fabrication of the detector 52 and bias circuit employing a suitable mask but prior to the mounting of the laser 14. The channel 72 is etched in the region of detector 52 so that light emitted from the rear facet 28 of the laser 14 is more efficiently collected.

In each of the described emodiments, the current supply leads 34 and 36 to the laser 14 are connected directly across the device so that laser biasing will not interfere with the circuit for the detector. The mounting pad 20 is fabricated to be larger than the mounting area of the laser so that lead 34 can be connected to the pad as shown at 74. Pad 20 being a low resistance contact, the laser 14 may be forward biased without any leakage of the laser drive current into the back biased Schottky detector circuit and interferring with its detection sensitivity.

Another manner of accomplishing such circuit separation may be by providing a high resistance barrier such as with p-n junction isolation regions in the substrate 12 between the detector 52 and the laser 14.

An example of fabrication of the FIG. 3 configuration of the hybrid laser/detector is as follows.

A (100) n-type silicon wafer is used as substrate 12. The wafer is first cleaned in organic solvents and then etched in hydrogen flouride to remove any oxide. Next, chromium-gold pads 20 and 52 are evaporated onto the cleaned surface 22 through a metal evaporation mask. Pad 20 for the laser mount is about 250 $\mu$m wide and about 1000 $\mu$m long and the Schottky barrier pad 52 is about 150 $\mu$m wide and 250 $\mu$m long. The edges of these pads are aligned with the (110) cleaved planes of the silicon wafer.

Chromium-gold is also evaporated onto the bottom of the silicon wafer to form the contact 18 for lead 38.

The silicon wafer is then etched with a solution of potassium hydride in water at 70° C. to a depth of 3 $\mu$m to form a surface which is recessed beneath the metal pad 52.

Next, a heterostructure diode laser 14 about 250 $\mu$m long between cleaved facets 26 and 28 is mounted p-side down on the pad 20 with tin or indium solder. As a final step, leads 34, 36 and 38 are bonded as shown using tin or indium solder.

Figure 6:
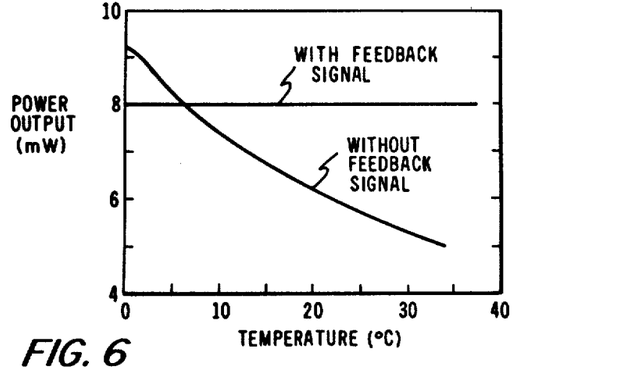
FIG. 6 is a graphic illustration of the light output power from the front laser facet of the structure shown in FIG. 3 as a function of pulsed laser drive current.

In operation, the laser 14 can be driven in either the CW or pulsed mode. The detector 52 collects about 1% of the total light emitted from facet 28. The sensitivity of the detector 52 is sufficient to provide stabilized feedback to laser 14. In FIG. 6, the laser light power output emitted from the front facet 28 is shown as a function of laser temperature with the laser operating in the CW mode. A thermoelectric cooler is used to vary laser temperature. Without any feedback signal employed and with a constant drive current of 107 mA, the optical output from facet 28 decreases from about 9 mW to about 5 mW between 0° C and 32° C. With the feedback signal and bias circuit 32 in operation, the variable bias current added to the external laser drive current is stabilized at desired power output, in this case 8 mW+0.1 mW, over the temperature range of 0° C. to 32° C.

In performing these tests, power outpt stabilization was also observed at lower power output levels, such as, 3 mW. Also, the average output power under pulsed mode operation was found to be maintained constant.

The signal obtained from the Schottky detector 52 can be used to stabilize laser power output to within about 2% over a 32° C. temperature range. Thus, a simple but effective hybrid structure with good heat sink properties is provided that eliminates the necessity of using coupling fibers to external type detectors that must be properly mounted and aligned relative to the laser emitting facet.

For comparison purposes, several FIG. 3 configurations were fabricated without provisions of the etched surface 56 and channel 58. The detected signal was about 20 times smaller than the structure shown in FIG. 3 having the etched channel 58. The detected signal ranged from a sensitivity of about 1.0 $\mu$A/mW for unetched structures to about 5 $\mu$A/mW for structures having a 3 $\mu$m etched channel between the detector 52 and the laser 14. Sensitivity could be increased by fabricating an elongated Schottky barrier, that is, increase the length of the barrier in the direction perpendicular to the axis of the laser emitted light. This longer detector with the etched channel 58 would provide an increase in light collecting efficiency.

Figure 7:
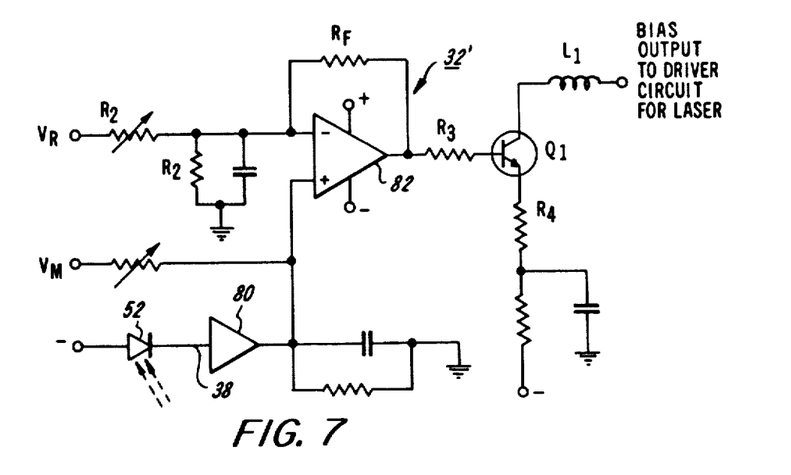
FIG. 7 is a known feedback control circuit that may be employed with the hybrid laser/detector of this invention to provide stabilized output.

FIG. 7 discloses another example of a bias circuit. This particular circuit is known in the art. Circuit 32' provides an output bias current which is adjusted to maintain the power output constant relative to a reference value. The light detected by detector 52 is amplified by current amplifier 80. The input $V_m$ is the minumium DC reference level and with the amplified photocurrent represents the bias current. The input $V_R$ represents the signal reference current or the main drive current. Resistor $R_2$ balances this current with the photocurrent for proper desired duty ratio. Operational amplifier 82 sums the inputs from amplifier 80, $V_R$ and $V_M$ and provides an output voltage resulting in the automatic adjustment of output current to laser 14 through transistor $Q_1$ via an appropriate driver circuit (not shown). Any changes in laser characteristics due to temperature changes and aging are automatically adjusted for in the output and the balance between $V_R$ and the developed photocurrent from detector 52 is restored.

Figure 8:
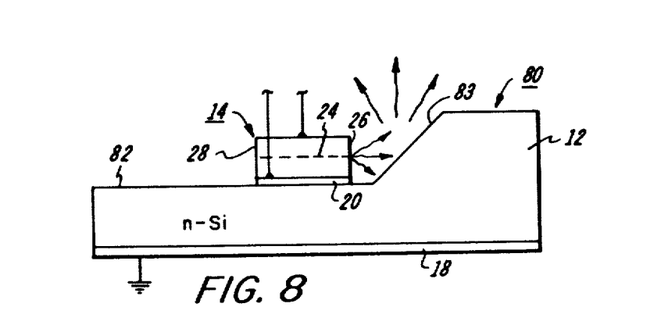
FIG. 8 is a side elevation of a still further embodiment of a hybrid laser/detector wherein the detector is positioned on an angled surface relative to surface plane of the substrate.
Figure 9:
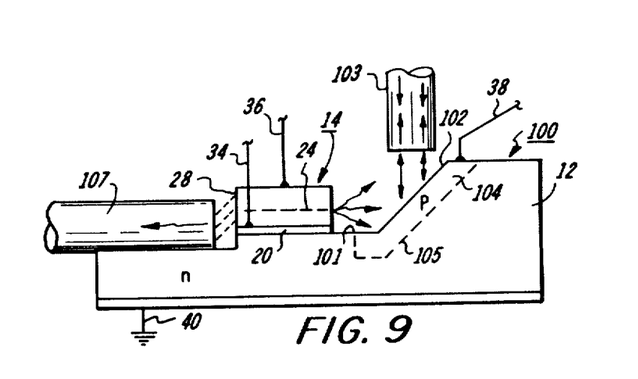
FIG. 9 is similar to the structure shown in FIG. 8 and includes an oblique surface detector that is partially reflective for communication with a light pipe.
Figure 10:
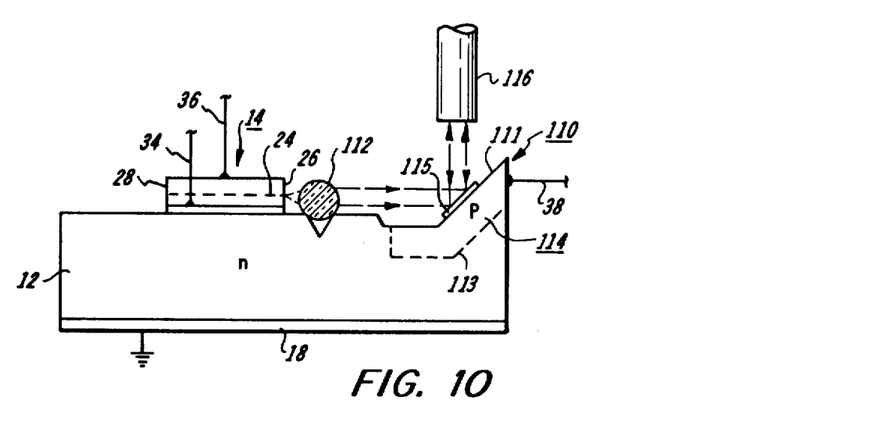
FIG. 10 is similar to the structure shown in FIG. 9 and includes a collimating lens and a metalized area on the detector surface.

In FIGS. 8, 9 and 10, previous employed numerals are again employed for identical components previously described and without need for further description.

In FIG. 8, the structure 80 includes laser 14 mounted on an etched surface 82 which has an oblique or angled surface 83 from which light from facet 26 is reflected for coupling into an optical system which is not colinear with the plane of the laser emitted light. The light may be either fully reflected by a highly reflecting surface at 83 or the surface 83 may function as a beam splitter such that some of the emitted light is reflected and some of the light is transmitted into the substrate mount. The reflecting surface 83 may be metal or have fabricated thereon a dielectric stack filter of the type shown in U.S. Pat. No. 4,009,453. The oblique surface 83 may be at any number of angles relative to surface of the substrate in order to perform this beam splitter function.

Specific applications of this function are shown in FIGS. 9 and 10 relative to hybrid laser/detector configurations.

In FIG. 9, the hybrid laser/detector 100 comprises the laser 14 mounted on the metalized pad 30 deposited on the etched surface 101 of the substrate 12. The surface 101 is etched so that the beam splitter surface 102 is formed. The surface 102 reflects and couples a portion of the light into an optical fiber 103 for transmission for example, in an optical communication system. A second portion of the light is refracted into a detector 104 diffused in substrate 12. Detector 104 is shown as a diffused p-n junction 105. Other types of detectors can be employed, such as, a Schottky barrier. The detected signal may be employed for feedback to control the drive current of laser 14 and thereby minimize power output fluctuations caused by environmental temperature changes or by structural degradation of laser 14.

In addition, the detector 104 can also detect light received from fiber 103 so that the single fiber 103 may be employed to both send and receive data in an optical communication system, data being sent by modulation of laser 14 and data being received by detector 104. Thus, detector 104 may perform two functions, laser stabilization and detection in an optical communication system.

An etched groove in surface 106 of substrate 12 may be aligned relative to facet 28 to receive optical fiber 107 to couple light from laser facet 28 into fiber 107 to form another link in an optical communication system.

A lens may be provided in front of laser facet 26 to collimate the laser light directed to surface 102.

In FIG. 10, the hybrid laser/detector 110 comprises the laser 14 mounted on the surface of substrate 12 with the angled surface 111 etched into the substrate 12 to receive light emitted from facet 26. The light is collimated by lens 112. Lens 112 may be a spherical (bead) lens or a cylindrical lens in the form of an optical fiber or a graded index fiber.

A p-type impurity is diffused into the substrate surface forming the p-n junction 113 forming detector 114. Detector 114 has a large light collecting area. A metallized area 115 is evaporated on a portion of the detector surface to provide a reflecting surface. The lens 112 maintains beam divergence low and directs most of the light onto the metalized surface which is reflected and coupled into optical fiber 116. Fiber 116 may be part of an optical communication system. The metalized mirror surface 115 impoves laser transmission into the fiber 116. The small portion of the light reaching areas of surface 111 adjacent to surface 115 is refracted into detector 114 and the signal on line 38 may be employed for feedback to control the drive current of laser 14 as previously explained.

Since the surface area of detector 114 is large compared with reflecting surface 115, light received from fiber 116 will diverge and be collected by the larger surface area of the detector 114 so that the detector may be employed as signal receiver for further communication and processing.

Other types of detectors may be employed in lieu of detector 114. For example, the metalized region 115 may be a transparent tin oxide Schottky barrier capable of reflecting a portion of the emitted light as well as absorbing a portion of the light that may be used as a feedback signal in the case of controlling the level of laser emitted light or may be used for signal detection in the case of optical fiber coupled light.

Figure 11:
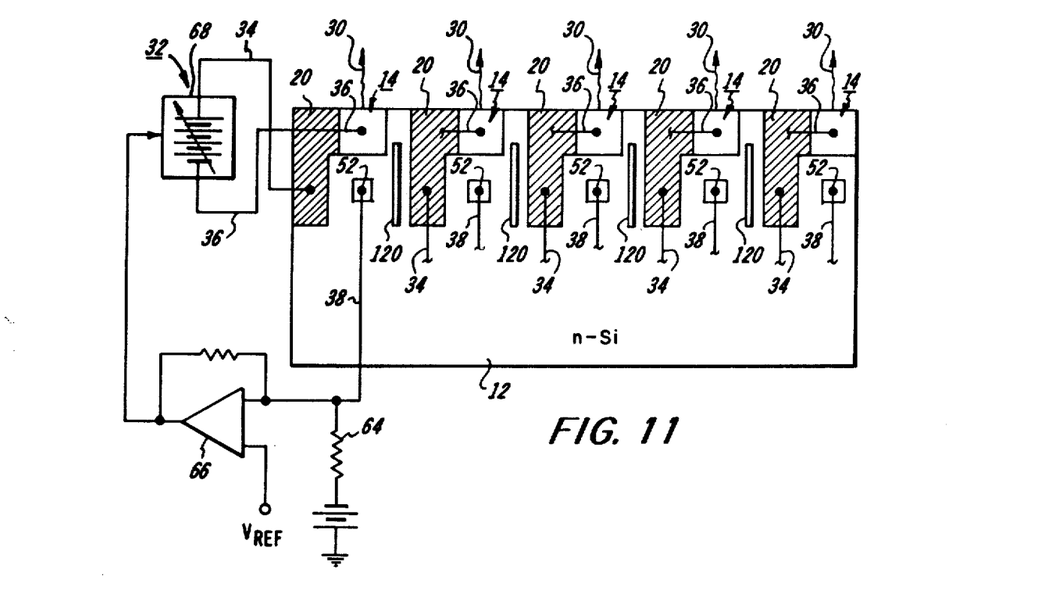
FIG. 11 is a plane view of an array of hybrid laser/detectors.

Any of the foregoing configurations can be fabricated and employed as a linear array of discrete hybrid laser/detectors, such as shown in FIG. 11. The arrangement comprises a plurality of structures shown in FIG. 3 with each laser 14 and aligned detector 15 being connected by respective leads 34, 36 and 38 to a discrete bias circuit 32 as shown in FIG. 4. During fabrication, regions 120 may be provided between adjacently aligned laser/detectors to act as barriers to divergent light reducing cross-talk. These regions 120 may be either metallized stripes co-planar with the substrate or they may be metallized or non-metallized barriers fabricated in a similar manner as the detector 52 in FIG. 4. Prior to metalization, a p-type diffusion might be used to positively isolate (electrically) the combination laser/detectors from one another. The employment of regions 120 would be best suited for multiple configurations of FIG. 4 wherein each of the lasers 14 are at a lower elevation compared to detector 52.

While the invention has been described in conjunction with specific embodiments, it is evident that many alternatives, modifications and variations will be apparent to those skilled in the art in light of the foregoing description. Accordingly, it is intended to embrace all such alternatives, modifications, and variations as fall within the spirit of the appended claims.

What is claimed is:

1. A hybrid semiconductor laser/detector on a single semiconductor substrate, said laser having front and rear light emitting facets and being mounted on the surface of said substrate, an optical detector integral to said substrate, said detector being adjacent to one of said light emitting facets to detect a small portion of the light emitted therefrom, a bias circuit connected to supply an operating current to said laser, said detector being connected to said bias circuit to provide a feedback signal proportional to the detected light from said one facet to adjust and maintain said operating current to provide a predetermined optical power output level and means formed on said substrate to enhance the light collecting efficiency of said detector, said laser mounted on a metalized region formed on said substrate surface, the elevation of said mounted laser being below said detector, a portion of said metalized region extending on said substrate surface beyond said mounted laser, said extended portion acting as a reflector and constituting said substrate formed means.

2. The hybrid semiconductor laser/detector of claim 1 wherein there is means to electrically connected said laser and detector to said bias circuit such that said operating current does not electrically interfere with the operation of said detector.

3. The hybrid semiconductor laser/detector of claim 1 wherein a linear array of said lasers and corresponding detectors are mounted on the same substrate, each of said laser/detectors controlled by independent bias circuits.

4. The hybrid laser/detector of claim 3 wherein said laser/detectors are optically separated by a barrier therebetween.

5. The hybrid semiconductor laser/detector of claim 1 wherein said detector is a Schottky barrier formed on said substrate.

6. The hybrid laser/detector of claim 1 wherein said detector is a diffused p-n junction formed in said substrate.

7. The hybrid laser/detector of claim 6 wherein an optical collecting lens is positioned on a region of said p-n junction.

8. A hybrid semiconductor laser/detector on a single semiconductive substrate, sid laser having front and rear light emitting facets and being mounted on the surface of said substrate, a Schottky barrier formed on said substrate to function as an optical detector, said detector being adjacent to one of said light emitting facets to detect a small portion of the light emitted therefrom, a bias circuit connected to supply an operating current to said laser, said detector being connected to said bias circuit to provide a feedback signal proportional to the detected light from said one facet to adjust and maintain said operating current to provide a predetermined optical powder output level and means to electrically connect said laser and detector to said bias circuit such that said operating current does not electrically interfere with the operation of said detector, said laser mounted on a metalized region formed on said substrate surface, the elevation of said mounted laser being below said detector, a portion of said metalized region extending on said substrate surface beyond said mounted laser, said extended portion acting as a reflector and constituting said substrate formed means.

9. The hybrid semiconductor laser/detector of claim 8 wherein a linear array of said lasers and corresponding detectors are mounted on the same substrate, each of said laser/detectors controlled by independent bias circuits.

10. The hybrid laser/detector of claim 9 wherein said laser/detectors are optically separated by a barrier therebetween.

* * * * *